(12) United States Patent
Lin et al.

(10) Patent No.: US 8,314,780 B2
(45) Date of Patent: Nov. 20, 2012

(54) TOUCH DEVICE

(75) Inventors: Jao-Ching Lin, Taipei (TW); Linabel Chu, Taipei (TW); Wen-Ting Lee, Taipei (TW)

(73) Assignee: Sentelic Corporation, Neihu Dist., Taipei (TW)

( * ) Notice: Subject to any disclaimer, the term of this patent is extended or adjusted under 35 U.S.C. 154(b) by 400 days.

(21) Appl. No.: 12/644,648

(22) Filed: Dec. 22, 2009

(65) Prior Publication Data

US 2011/0122072 A1 May 26, 2011

(30) Foreign Application Priority Data

Nov. 26, 2009 (TW) ................. 98222139 U (51) Int. Cl.
*G06F 3/044* (2006.01)

(52) U.S. Cl. ..................... 345/174; 178/18.06

(58) Field of Classification Search ........... None
See application file for complete search history.

(56) References Cited

U.S. PATENT DOCUMENTS

| | | | |
|---|---|---|---|
| 5,854,625 A | 12/1998 | Frisch et al. | |
| 7,630,200 B1 * | 12/2009 | Eldershaw | 361/679.57 |
| 2007/0052961 A1 | 3/2007 | Lane et al. | |
| 2007/0262968 A1 | 11/2007 | Ohshita et al. | |
| 2011/0267300 A1 * | 11/2011 | Serban et al. | 345/174 |

* cited by examiner

*Primary Examiner* — Wayne Young
*Assistant Examiner* — Brian Butcher
(74) *Attorney, Agent, or Firm* — Winston Hsu; Scott Margo (57) ABSTRACT

A touch device includes a touch pad and a base having an accommodating region and at least one first conductor. The touch pad is received in the accommodating region and subjected to a force to generate a changeable position relative to the base. The touch pad has a touch surface consisting of a plurality of capacitive sensors and at least one second conductor connected with at least one of the capacitive sensors. The second conductor is electrically connected with the first conductor. Capacitances measured from the capacitive sensors are substantially different between the touch surface touched with a conductive object and the second conductor connected with the first conductor, which is connected to a fixed voltage, current or a ground. Therefore, a control unit connected to the capacitive sensors can generate different control signals from the connecting state between the first conductor and the second conductor.

19 Claims, 14 Drawing Sheets

TOUCH DEVICE

BACKGROUND OF THE INVENTION

1. Field of the Invention

The present invention relates to a touch device, and in particular to a touch device in which a touch pad and a base are provided. A touch of conductive object on the touch pad and a relative movement between the touch pad and the base are all detected via the same capacitive sensors on the touch pad, so that it is unnecessary to provide force sensors and associated circuits to detect the movement.

2. Description of Prior Art

Touch device is provided with a pad on which a plurality of sensors is arranged, whereby contact behaviors of an object on the pad can be detected. There are many kinds of sensors, and capacitive sensors are used herein as an example for illustration. Such capacitive sensors are constituted of conductors and are connected to a controller for scanning the respective capacitances of the sensors. When an electrical conductive object approaches the pad, the capacitances of the sensors will be changed. By comparing the difference between the capacitances of the sensors in different positions, the region touched by the electrical conductive object can be determined. Thus, when using the capacitive touch device, the user only needs to use a conductive object 61 (such as his finger) to touch the pad for coordinates input, such as pressing keys or buttons to trigger the operation, or inputting pointing control signals.

Although the above-mentioned touch device can convert the sliding trajectory of the conductive object 61 into the output of the pointing control signals, it still cannot replace all functions of the traditional mouse such as left/right keys, scrolling roller, and dragging desired images or words by pressing the left key then moving the mouse. Thus, in addition to a traditional touch pad, two buttons adjacent to the touch pad have to be provided for operations of the left/right keys. Even though the user may operate the touch pad to trigger the control signals like the mouse via assistance of the two buttons, such a touch pad still cannot satisfy the operating habit of the user. On the other hand, for the user, operating the touch pad lacks a tactual feedback generated when pressing the keys.

The tactual feedback accompanied with pressing the keys not only conforms to the habit of the user as operating mechanical keys, but also provides the user with an informative signal related to the completion of pressing.

U.S. Pat. No. 5,854,625 discloses a force sensing touch pad, in which a sensor board and a plurality of spring structures are provided in a frame. The spring structures can support the relative movement of the sensor board respected to the frame. A plurality of capacitors is used to measure the distance between the sensor board and the frame. When the user tips the sensor board, only touch signals are outputted. When the user presses the sensor board, the plurality of capacitors will send a signal relating to the distance, thereby providing another force-operated signal.

Also, U.S. Patent Publication No. 2007/0262968 discloses an input device, which includes a capacitive touch pad, a data processor and a switch. When the capacitive touch pad is pressed, the switch is turned on, so that the data processor can output control signals different from those before pressing.

Thus, either the capacitor or electric switch is a force sensor that is provided outside a touch sensor to output force signals to a controller of the touch sensor. In this way, the controller can be switched to output different control signals and the functions of the touch pad can be expanded. For example, tipping the touch pad is one operating mode, and pressing the touch pad is another operating mode.

According to the above, no matter what kind of force sensors is used, the controller of the touch pad has to be additionally provided with an input port and operational circuits to process the force signals. In addition, in order to compare the touch signals with the force signals at the same time, the controller has to be provided with a synchronous clock circuit. To reduce the influence of electromagnetic waves on the original analysis circuits caused by the circuits associated with the force sensor, the whole dimension of the controller will be inevitably increased. Therefore, in order to process the force signals, additional elements such as operational circuits, the synchronous clock circuit, and electromagnetic wave protection circuit not only raise the cost in designing and developing integrated circuits (IC), but also increase the dimension of ICs and the basic cost of products.

In view of the above, it is an important issue for the present inventor to expand the input functions of the touch pad without providing an additional force detection circuit or modifying the analysis circuit for touch detection, whereby the production cost is reduced and the sensitivity of products is increased.

SUMMARY OF THE INVENTION

In order to solve the above problems, an objective of the present invention is, to provide a touch device capable of expanding the input function of the touch pad.

Another objective of the present invention is to provide a touch device capable of generating force feedback without providing force detectors and associated circuits or modifying touch analysis circuits.

A further objective of the present invention is to provide a touch device capable of simplifying the design of circuits and reducing production cost.

In order to achieve the above objectives, the present invention is to provide a touch device including a base, a touch pad, and a control unit. The base has an accommodating region and at least one first conductor. The touch pad is received in the accommodating region with a changeable position relative to the base. The touch pad has a touch surface and at least one second conductors. The touch surface is arranged with a plurality of capacitive sensors. The capacitive sensors are electrically connected to the control unit for generating sensor signals to the control unit. The second conductor is electrically connected to the capacitive sensors and electrically conducted with the first conductor based on the change of relative position between the touch pad and the base. The control unit is configured to analyze the sensor signals and generate at least one control signal based on the state of electrical conduction between the first conductor and the second conductor. The control signal makes the touch pad to generate a force feedback. With this arrangement, it is unnecessary to provide force detectors and associated circuits or to modifying analysis circuit, thereby simplifying circuit design and reducing production cost.

The present invention has advantages features as follows:
(1) a force feedback can be generated without providing force detectors and associated circuits;
(2) a force feedback can be generated without modifying analysis circuits;
(3) the circuit design is simplified; and
(4) the production cost is reduced.

In order to make the Examiner to further understand the characteristics and technical contents of the present invention, a description relating thereto will be made with reference to accompanying drawings. However, the drawings are illustrative only, but not used to limit the scope of the present invention.

DETAILED DESCRIPTION OF THE INVENTION

The above-mentioned objectives, structural and functional characteristics of the present invention will be described with reference to the following preferred embodiments and the accompanying drawings.

Figure 1:
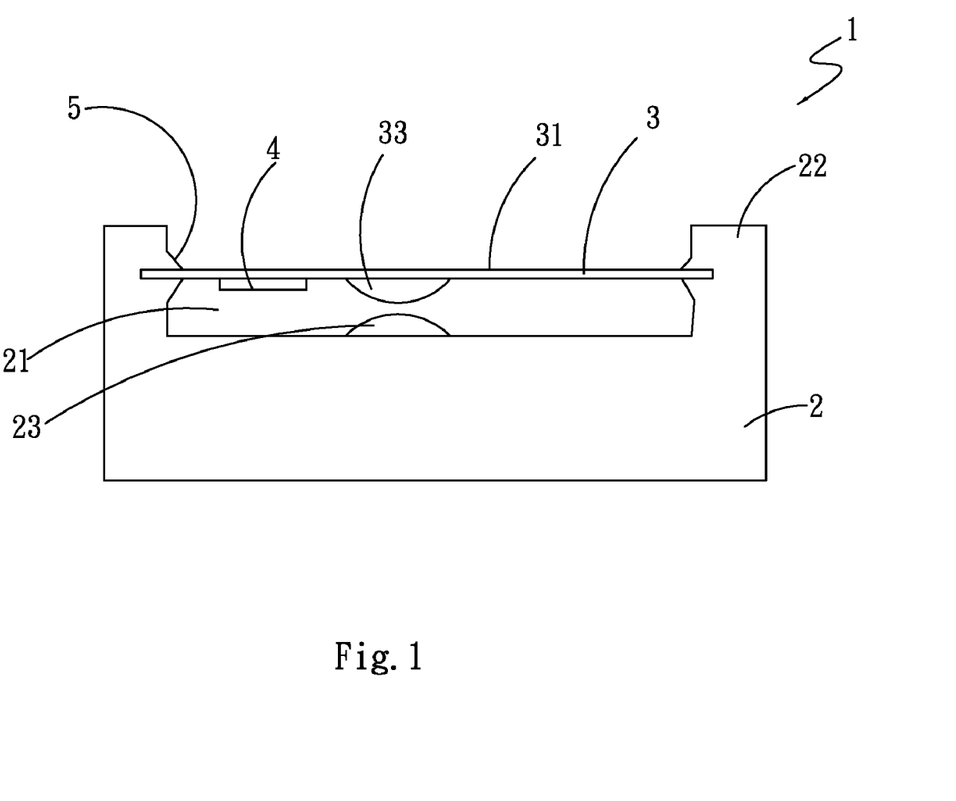
FIG. 1 is a schematic view showing a structure of a touch device according to a preferred embodiment of the present invention.
Figure 2:
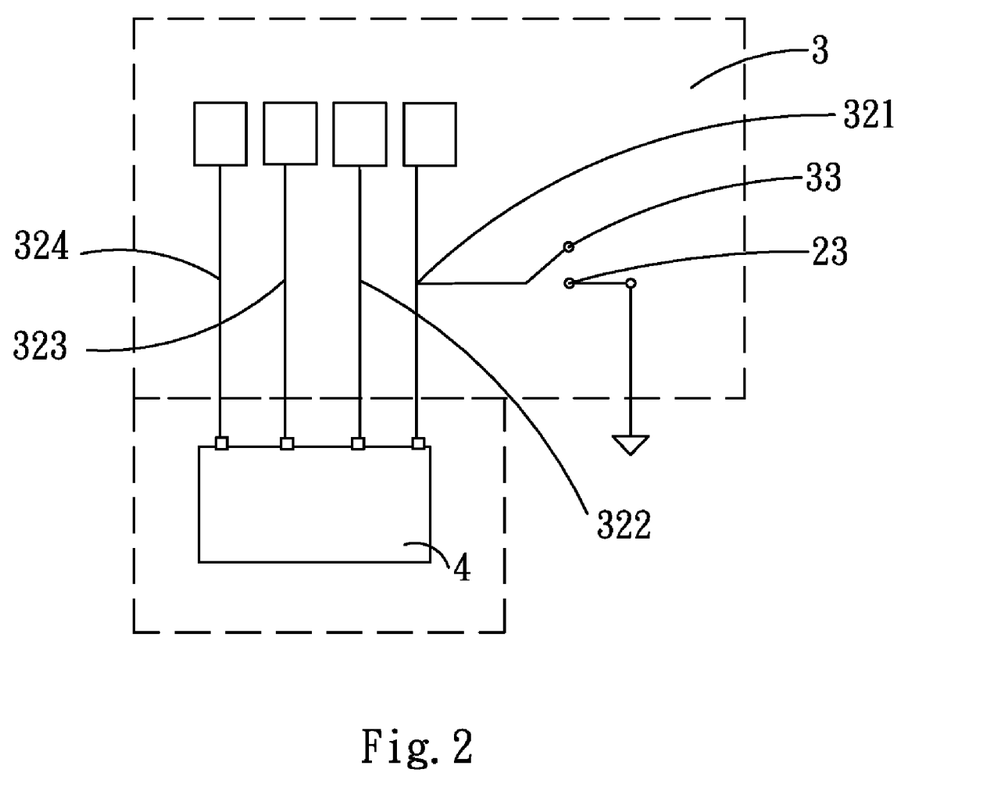
FIG. 2 is a block view showing the preferred embodiment of the present invention.

Please refer to FIGS. 1 and 2. The touch device 1 of the present invention includes a base 2, a touch pad 3 and a control unit 4. The base 2 has an accommodating region 21, at least one side wall 22 and a first conductor 23. The accommodating region 21 is used to accommodate the touch pad 3. The touch pad 3 is subjected to a force to generate a changeable position with respect to the base 2. The control unit 4 is provided on an upper surface or lower surface of the touch pad 3, or on a surface of the base 2.

In the touch device 1, a position recovering means 5 is provided between the touch pad 3 and the base 2. The first conductor 23 is provided in the accommodating region 21. The first conductor 23 is electrically connected to one of a constant voltage source, a constant current source or the ground, and FIG. 2 shows that the first conductor 23 is grounded. The touch pad 3 has a touch surface 31 and at least one second conductor 33. The touch surface 31 is arranged with a plurality of capacitive sensors 321, 322, 323, 324 that are electrically connected to the control unit 4. However, the capacitive sensors shown in FIG. 2 are illustrative only, but not used to limit the form and number of the capacitive sensors. The capacitive sensors 321, 322, 323, 324 are configured to generate a plurality of sensor signals to the control unit 4. The second conductor 33 is positioned to correspond to the first conductor 23. The second conductor 33 is electrically connected to the capacitive sensor 321.

Figure 3:
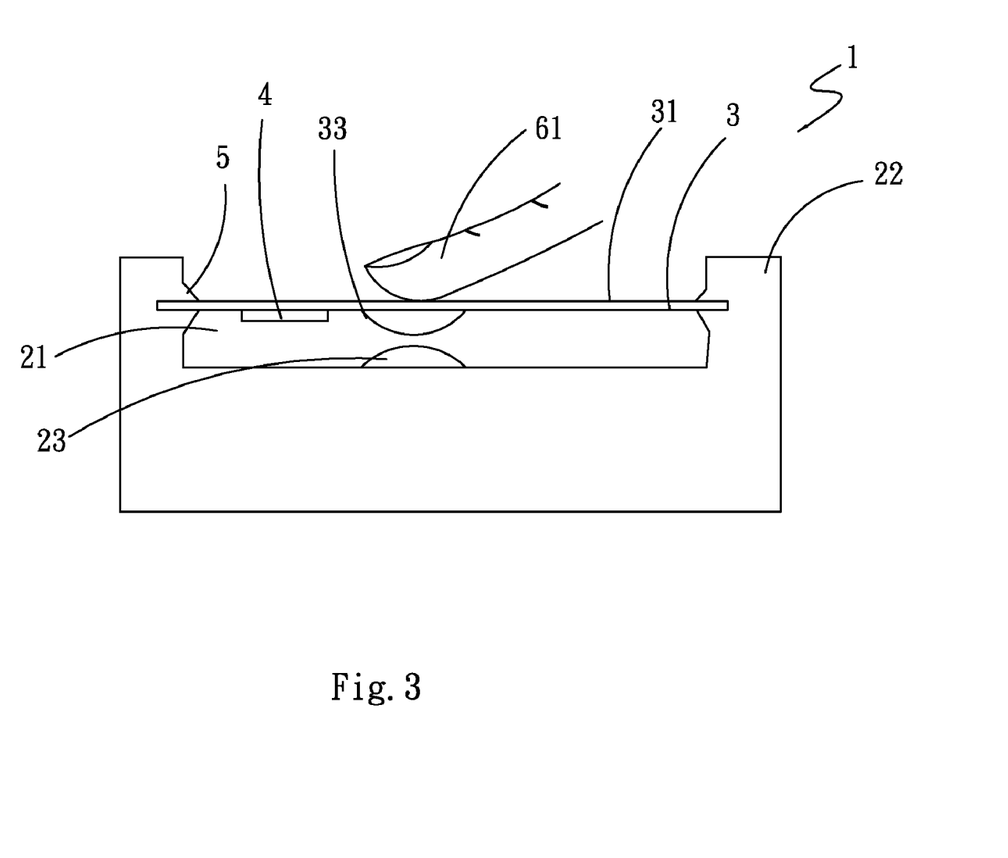
FIG. 3 is a schematic view (I) showing an operating state of the touch device according to the preferred embodiment of the present invention.

Please refer to FIGS. 2 and 3. In the present embodiment, the first conductor 23 of the base 2 is provided in the accommodating region 21 and grounded. The second conductor 33 is positioned on the other surface opposite to the touch surface 31 to correspond to the first conductor 23. The second conductor 33 is electrically connected to the capacitive sensor 321. The control unit 4 is configured to scan the sensor signals generated by the capacitive sensors 321, 322, 323, 324 on the touch surface 31, thereby determining whether there is a conductive object 61 (such as a finger) on the touch surface 31 and outputting a first control signal relating to the position touched by the conductive object 61 (such as a finger).

Figure 4:
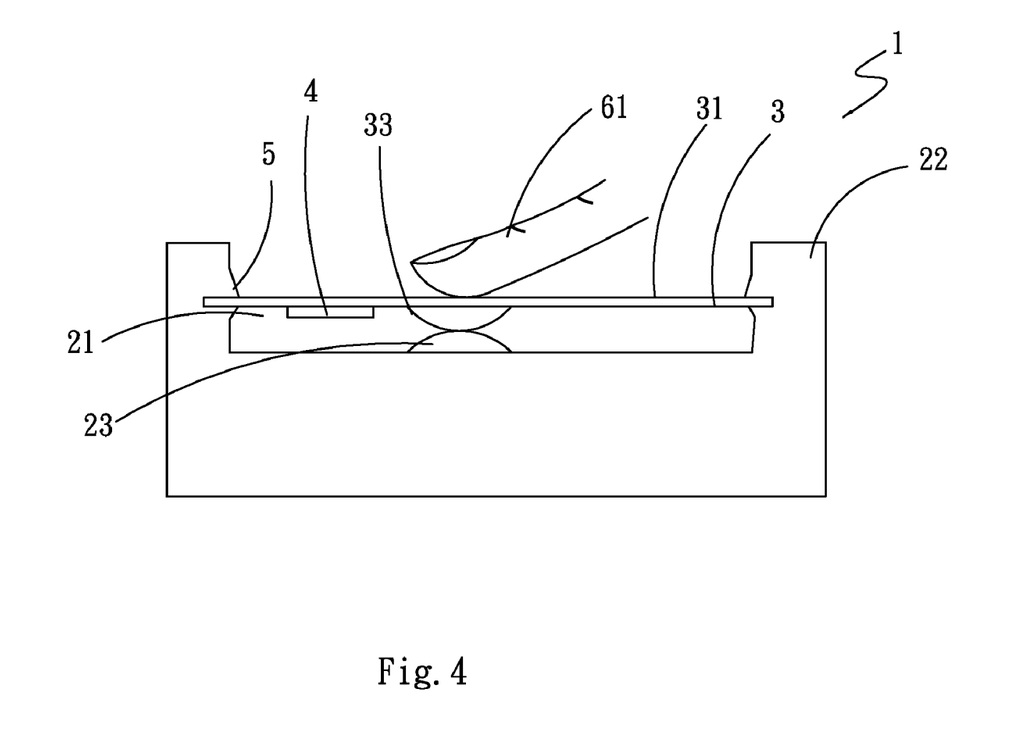
FIG. 4 is a schematic view (II) showing an operating state of the touch device according to the preferred embodiment of the present invention.
Figure 5:
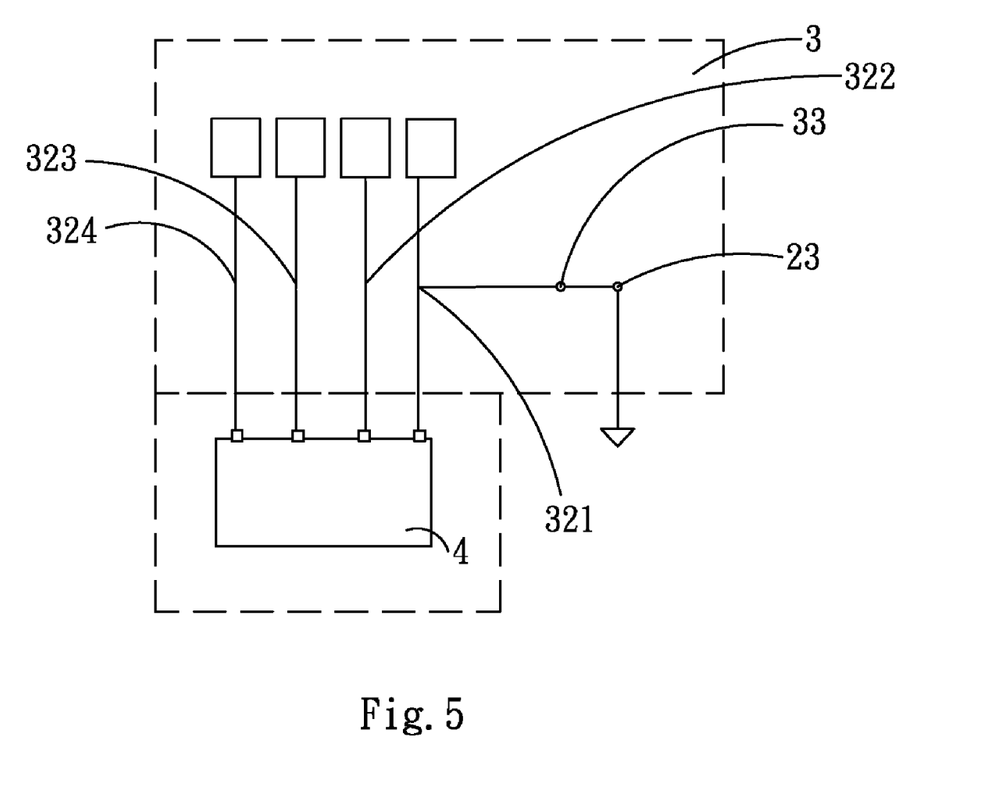
FIG. 5 is a block view (I) showing an operating state of the preferred embodiment of the present invention.

Please refer to FIGS. 4 and 5. In the present embodiment, when the conductive object 61 (such as the finger) touches the touch surface 31 to bias the touch pad 3 toward the base 2, the second conductor 33 on the touch pad 3 will be electrically conducted with the first conductor 23 and then grounded. In this way, the capacitive sensor 321 is affected by the grounding of the second conductor 33 so as to generate different electric properties from other capacitive sensors 322, 323, 324. In addition, the first conductor 23 may be electrically connected to a constant voltage source or a constant current source instead of the ground. With the first conductor 23 being electrically connected to the constant voltage source or the constant current source, the capacitive sensor 321 can also generate different electric properties than other capacitive sensor 322, 323, 324. In the present embodiment, the first conductor 23 is grounded.

The control unit 4 is configured to analyze the potential change of the capacitive sensor 321, thereby determining the contact state between the first conductor 23 and the second conductor 33. At the same time, the control unit 4 utilizes other capacitive sensors 322, 323, 324 to analyze information generated when they are touched by the conductive object 61 (such as the finger), thereby generating a second control signal different from the first control signal.

That is to say, when the conductive object 61 (such as the finger) tips the touch surface 31, only the first control signal indicating the touch position is outputted. When the touch force is large enough to make the second conductor 33 and the first conductor 23 to be electrically connected to the ground, the control unit 4 generates the second control signal different from the first control signal, such as a virtual signal simulating the pressing of keys, a signal indicating the touch position by different coordinates (larger or smaller travelling distance and change from the Cartesian coordinate to Cylindrical coordinate), and signals indicating handwritten characters or symbols.

Figure 6:
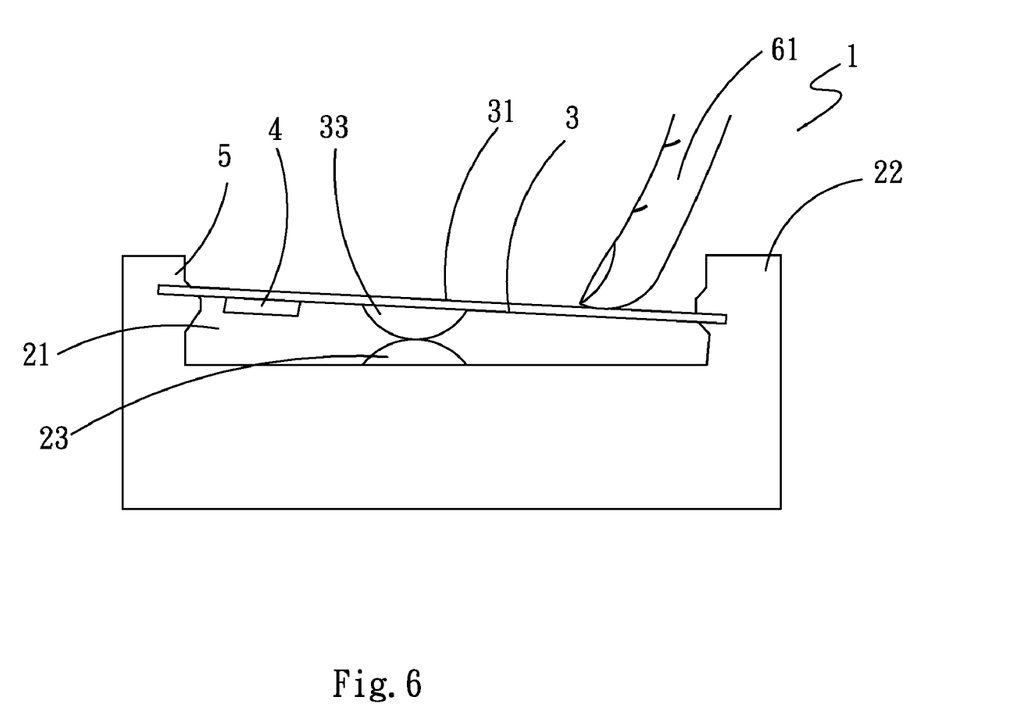
FIG. 6 is a schematic view (III) showing an operating state of the touch device according to the preferred embodiment of the present invention.
Figure 7:
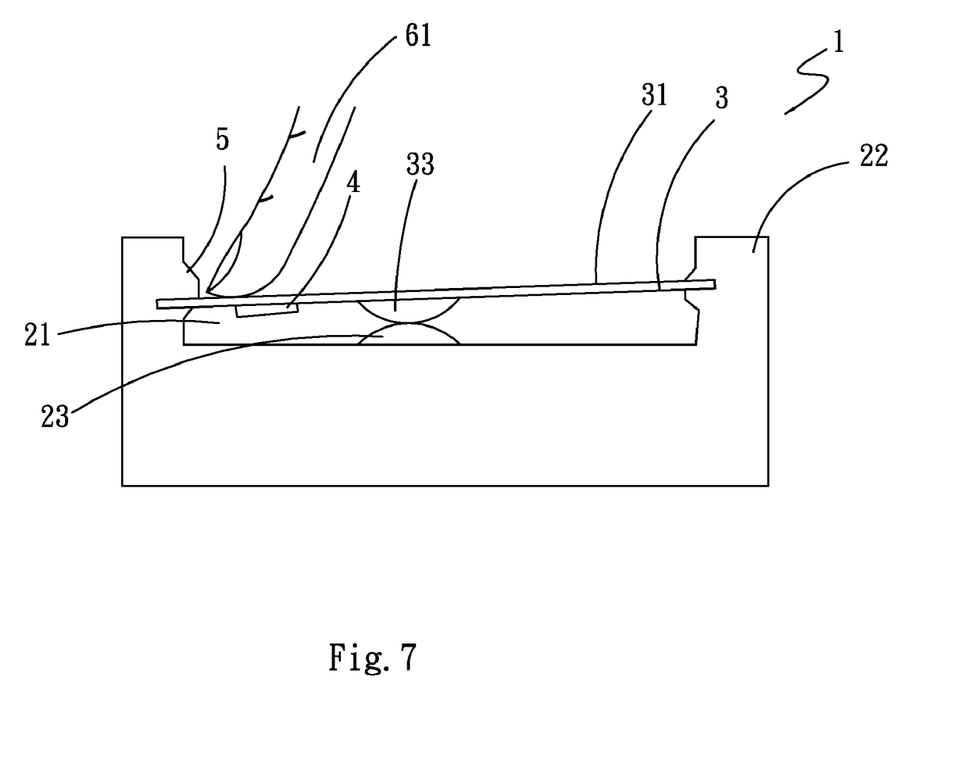
FIG. 7 is a schematic view (IV) showing an operating state of the touch device according to the preferred embodiment of the present invention.

FIGS. 5, 6, and 7 show a second embodiment of the present invention. The second conductor 33 and the first conductor 23 are arranged to be close to a middle line of the touch surface 31. Thus, not matter the conductive object 61 (such as the finger 61) presses the right portion of the touch surface 31 as shown in FIG. 6, or the conductive object 61 (such as the finger 61) presses the left portion of the touch surface 31 as shown in FIG. 7, the second conductor 33 can be electrically conducted with the first conductor 23. Although the control unit 4 only analyzes state of electrical conduction by means of the capacitive sensor 321 based on the above-mentioned two ways of pressing, the control unit 4 can still determine whether the electrical conduction is caused by pressing the right portion of the touch panel (FIG. 6) or by pressing the left portion of the touch panel (FIG. 7) based on the sensor signals of the other capacitive sensors 322, 333, 324. Thus, it is unnecessary to arrange two sets of conductors to detect two ways of pressing respectively, such as pressing the right key (FIG. 6) or the left key (FIG. 7). Further, the conductive object 61 (such as the finger 61) can slide on the touch surface 31 in such a manner that it presses the right portion of the touch surface 31 and slides along the right side of the touch surface 31. In addition to determine the state of electrical conduction, the control unit 4 can also generate a signal indicating upward or downward scrolling based on the sliding direction of the finger 61.

Figure 8:
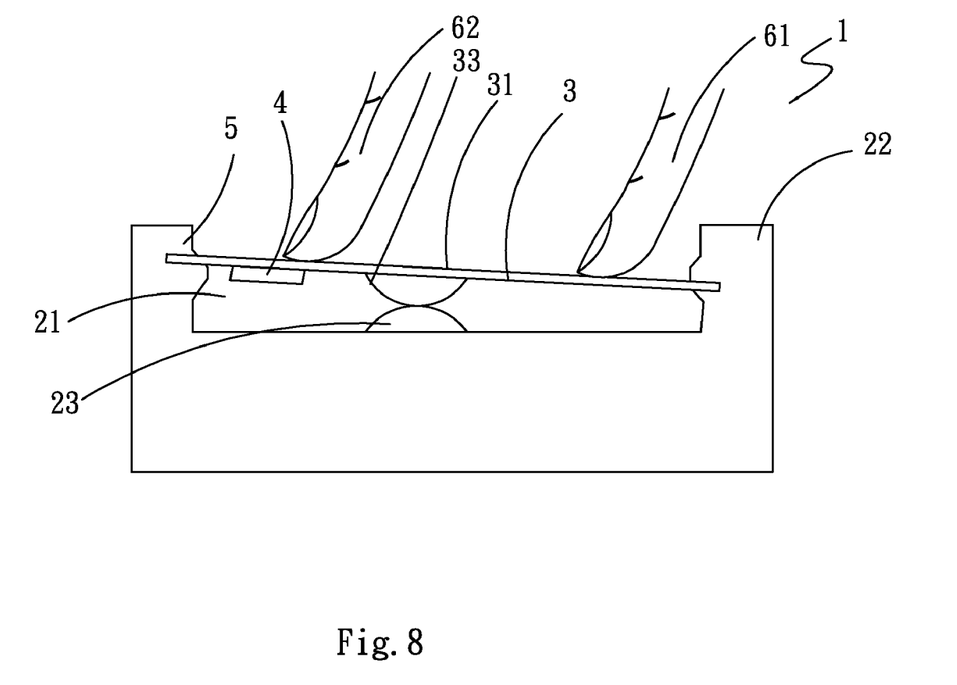
FIG. 8 is a schematic view (V) showing an operating state of the touch device according to the preferred embodiment of the present invention.
Figure 9:
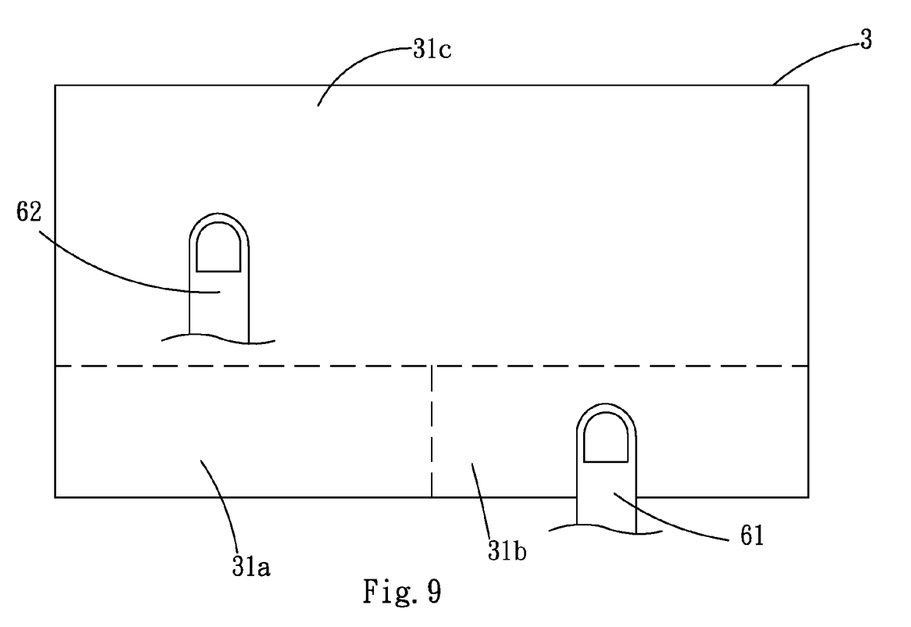
FIG. 9 is a schematic view (VI) showing an operating state of the touch device according to the preferred embodiment of the present invention.

As shown in FIGS. 8 and 9, in the second embodiment, if more than one conductive object 61 (such as the finger 61) touch the touch surface 31, for example, one conductive object 61 (such as the finger 61) presses the lower-right region 31b of the touch surface 31, and another conductive object 62 (such as the finger 62) slides on other region 31c of the touch surface 31. The control unit 4 can also determine all the positions touched by the fingers. The control unit 4 is configured to consider the finger touching the lower-left region 31a and the lower right region 31b of the touch surface 31 as a finger 61 pressing the touch surface 31, and consider the finger sliding on other region 31c as a finger 62 moving a cursor. In this way, the input mode (such as dragging) of pressing the left key and moving the mouse performed by the traditional mouse can be generated by the present invention. Similarly, the input mode of pressing the right key and moving the mouse can be also generated.

Figure 10:
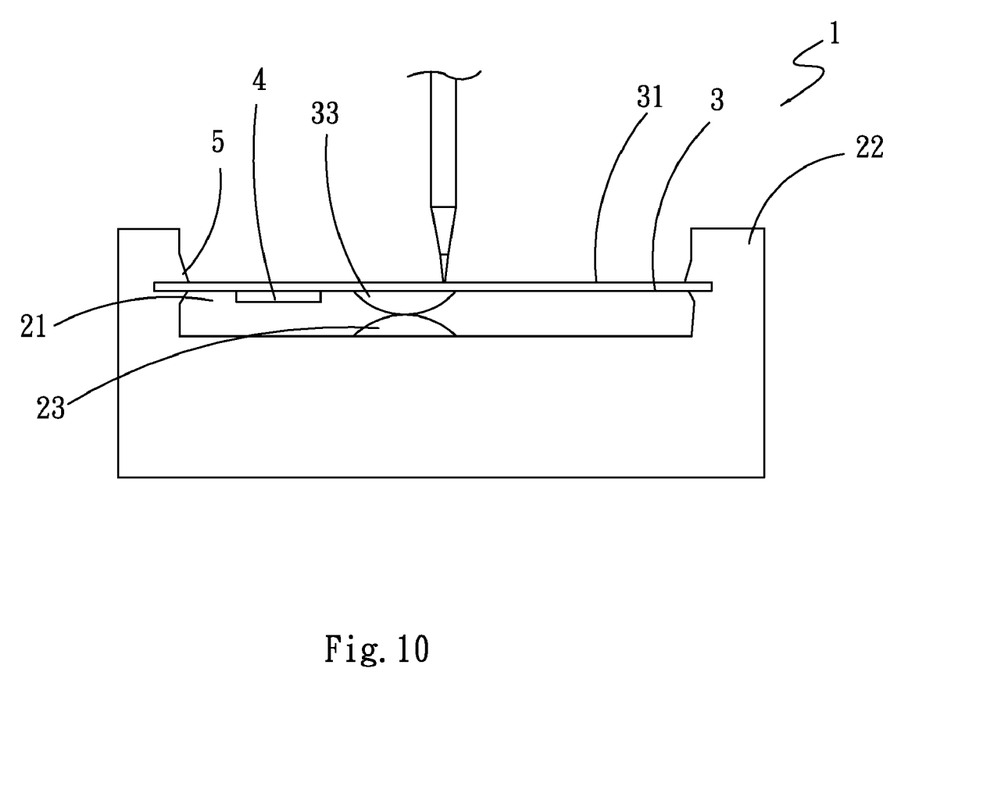
FIG. 10 is a schematic view (VII) showing an operating state of the touch device according to the preferred embodiment of the present invention.

FIGS. 2 and 10 show a third embodiment of the present invention. When a non-conductive object presses the touch surface 31 to electrically conduct the second conductor 33 with the first conductor 23, the control unit 4 determines the above state of electrical conduction based on the capacitive sensor 321, and determines no touch on the touch surface 31 so as to generate a third control signal. Different from the first control signal and the second control signal, the third signal may be, for example, a button switch signal, a signal indicative of number of pressing in duration, and a signal indicating pressing duration.

Please refer to FIGS. 3, 11 and 12 again. The base 2 has an accommodating region 21, at least one side wall 22, and a first conductor 23. The side wall 22 has a position recovering means 5 that is made of rubber or other polymeric materials of an elastic construction. In addition to make the touch surface 31 to suspend in one plane over the accommodating region 21 for relative movement, the position recovering means 5 can generate an elastic recovering force for allowing the touch surface 31 to return to its original position. In this way, the second conductor 33 can be kept electrically un-conducted with the first conductor 23 as absent of the force.

Figure 11:
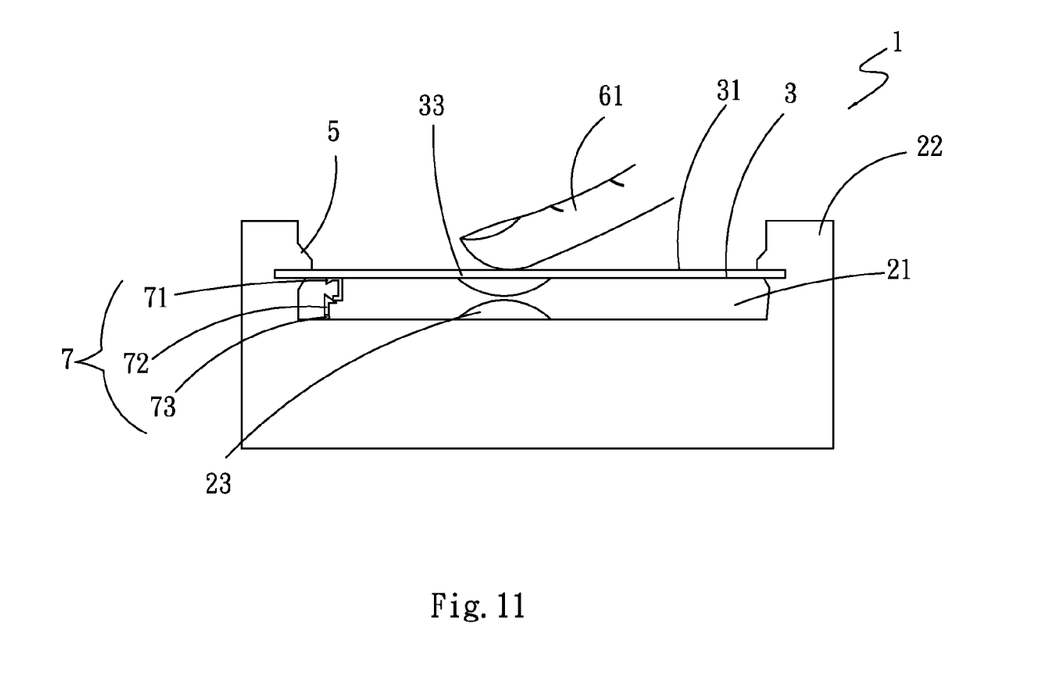
FIG. 11 is a schematic view (I) showing an operating state of the touch device according to another preferred embodiment of the present invention.
Figure 12:
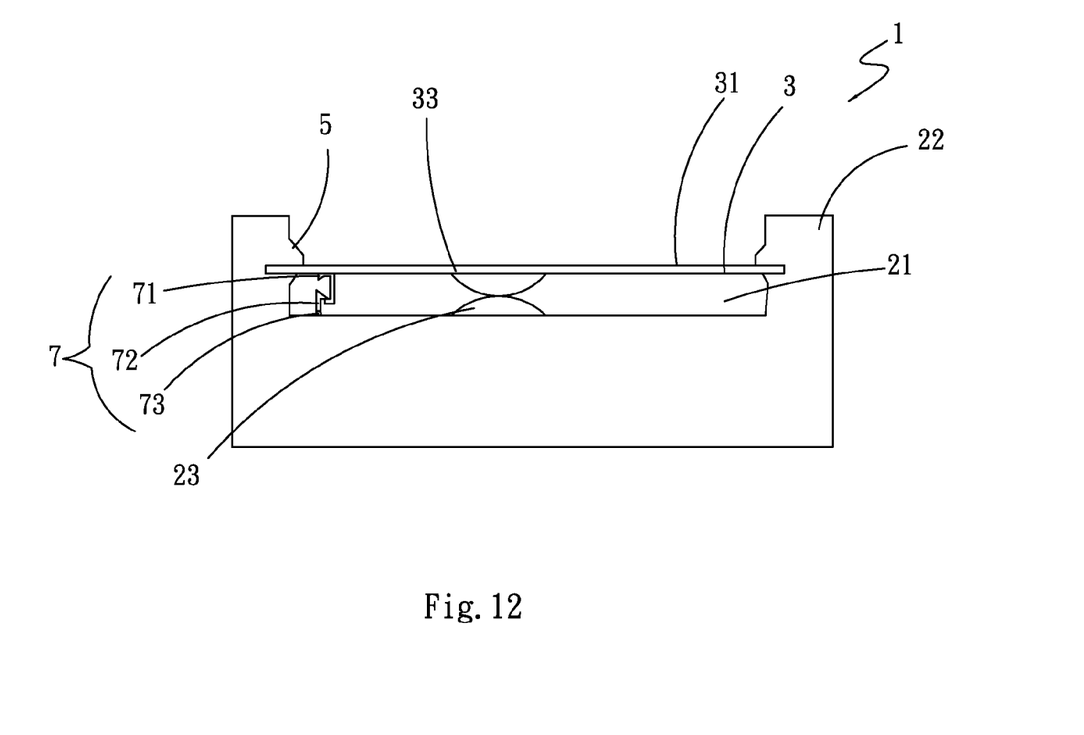
FIG. 12 is a schematic view (II) showing an operating state of the touch device according to another preferred embodiment of the present invention.

Further, the touch device 1 has a position fixing means 7. As shown in FIG. 11, the position fixing means 7 has a recess 71, a latch 72 and an elastic pivot 73. The recess 71 is located on the underside of the touch surface 31. The latch 72 is located on the opposite base 2. The latch 72 has the elastic pivot 73. When the touch surface 31 is pressed by the finger 61, the latch 72 is pushed by the recess 71 to move rearwards. After the finger 61 is removed from the touch surface 31, the latch 72 returns to the inside of the recess 71 by means of the elastic force of the elastic pivot 73, so that the second conductor 33 can be kept electrically conducted with the first conductor 32 even though the second conductor 33 is not subjected to a force (FIG. 12). At the same time, the latch 72 can be pushed by the upside of the recess 71 and then moves rearwards to depart from the inside of the recess 71. In this way, the recess 71 is released to make the touch surface 31 to return to the position shown in FIG. 11. As a result, the second conductor 23 and the first conductor 33 are not electrically conducted with each other.

According to the above, the touch surface 31 can be operated in a mode different from the operating mode of a common mouse, so that it is unnecessary to press the touch surface 31 continuously. For example, touching number keys displayed on the touch pad 3 can input numbers, or different conversion coordinates can be switched. Then, a user can press the touch surface 31 again to release the position fixing means 7, so that the touch pad 3 can return to its original position (FIG. 11) at which the touch pad 3 is not touched by the conductor 61. In this way, the operating mode of moving a cursor performed by a mouse can be recovered.

Figure 13:
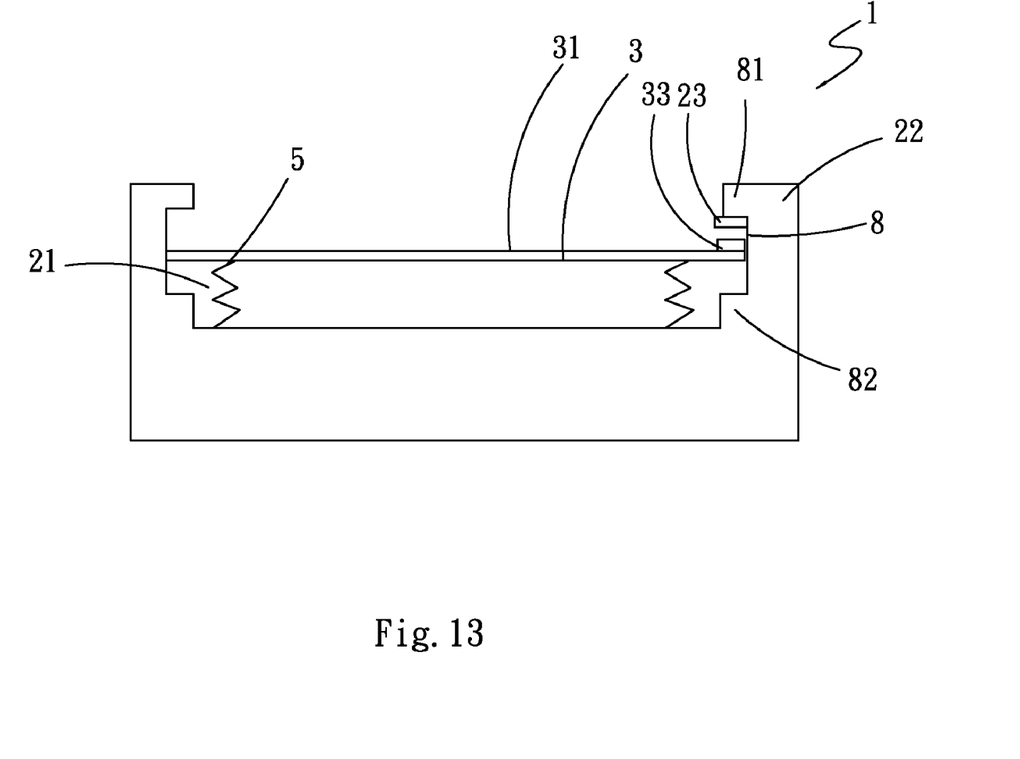
FIG. 13 is a schematic view (I) showing an operating state of the touch device according to a further preferred embodiment of the present invention.
Figure 14:
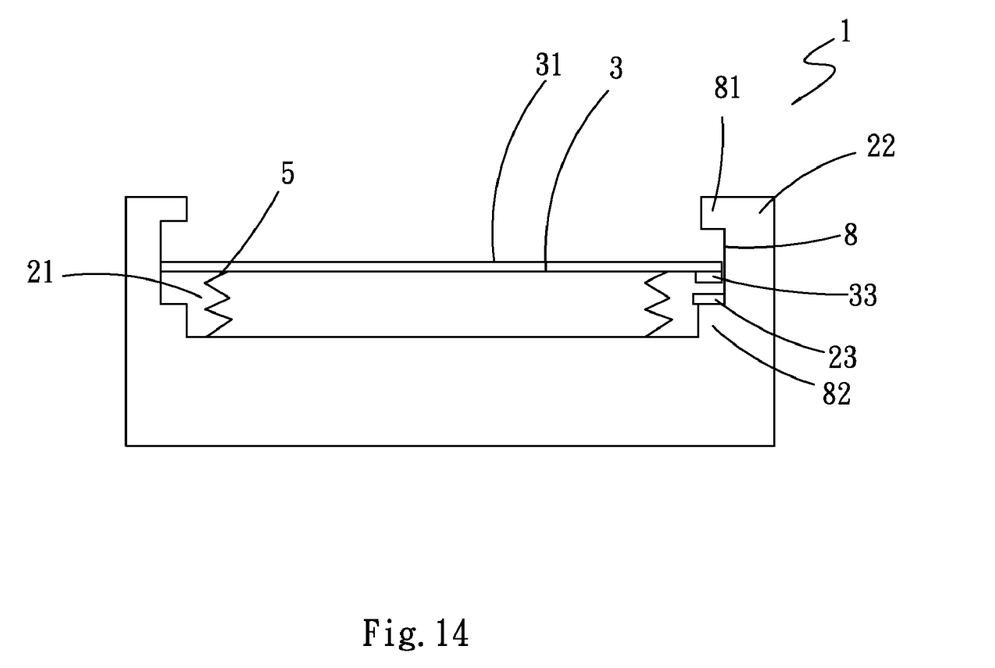
FIG. 14 is a schematic view (II) showing an operating state of the touch device according to a further preferred embodiment of the present invention.

As shown in FIGS. 13 and 14, the base 2 further includes a side structure 8 for restricting a moving range of the touch pad 3 in the accommodating region 21. The side structure 8 has at least one first stopper 81 and a second stopper 82. The first stopper 81 and the second stopper 82 are provided above and below the touch pad 3 respectively. The first conductor 23 is provided on the first stopper 81 (FIG. 13) or the second stopper 82 (FIG. 14) of the side structure 8. The second conductor 33 is provided on the upper surface (FIG. 13) or the lower surface (FIG. 14) of the touch pad 3 opposite to the first conductor 23, so that the first conductor 23 can be electrically conducted with the second conductor 33 when the position of the touch pad 3 is changed. The position recovering means 5 is disposed between the base 2 and the touch pad 3, so that the position of the touch pad 3 relative to the base 2 can be, kept.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A touch device, including:
    a base having an accommodating region and at least one first conductor;
    a touch pad received in the accommodating region, the touch pad having a touch surface and at least one second conductor, the touch surface being arranged with a plurality of capacitive sensors, the second conductor being electrically connected to the capacitive sensors; and
    a position fixing means provided between the touch pad and the base.

2. The touch device according to claim 1, wherein the touch device further has a position recovering means provided between the touch pad and the base.

3. The touch device according to claim 2, wherein the base includes at least one side wall, the position recovering means is provided between the touch pad and the side wall.

4. The touch device according to claim 1, wherein the first conductor is electrically connected to a constant voltage source.

5. The touch device according to claim 1, wherein the first conductor is electrically connected to a constant current source.

6. The touch device according to claim 1, wherein the first conductor is grounded.

7. The touch device according to claim 1, further comprising a control unit electrically connected to the plurality of capacitive sensors.

8. The touch device according to claim 7, wherein the control unit is configured to generate at least one first control signal when at least one conductive object touches the touch surface and the first conductor is not electrically conducted with the second conductor.

9. The touch device according to claim 7, wherein the control unit is configured to generate at least one second control signal when at least one conductive object touches the touch surface and the first conductor is electrically conducted with the second conductor.

10. The touch device according to claim 7, wherein the control unit is configured to generate at least one third control signal when the first conductor is electrically conducted with the second conductor and no conductive object touches the touch surface.

11. The touch device according to claim 1, wherein the second conductor is opposite to the first conductor.

12. The touch device according to claim 1, wherein the base further comprises at least one side structure for restricting a moving range of the touch pad.

13. The touch device according to claim 12, wherein the side structure has at least one first stopper and at least one second stopper, the touch pad is mounted between the first stopper and the second stopper to restrict the moving range of the touch pad.

14. The touch device according to claim 13, wherein the first conductor is mounted on the first stopper, where faces the second conductor on the touch pad.

15. The touch device according to claim 13, wherein the first conductor is mounted on the second stopper, where faces the second conductor on the touch pad.

16. A touch device, comprising:
a touch pad having a touch surface and at least one second conductor, the touch surface being arranged with a plurality of capacitive sensors, the second conductor being electrically connected to the capacitive sensors; and
a base having at least one first conductor, an accommodating region configured to receive the touch pad, and at least one side structure having at least one first stopper and at least one second stopper, the touch pad is mounted between the first stopper and the second stopper to restrict the moving range of the touch pad;
wherein the first conductor is mounted on the first stopper facing the second conductor on the touch pad.

17. The touch device of claim 16, further comprising a position recovering means disposed between the base and the touch pad.

18. A touch device, comprising:
a touch pad having a touch surface and at least one second conductor, the touch surface being arranged with a plurality of capacitive sensors, the second conductor being electrically connected to the capacitive sensors; and
a base having at least one first conductor, an accommodating region configured to receive the touch pad, and at least one side structure having at least one first stopper and at least one second stopper, the touch pad is mounted between the first stopper and the second stopper to restrict the moving range of the touch pad;
wherein the first conductor is mounted on the second stopper facing the second conductor on the touch pad.

19. The touch device of claim 18, further comprising a position recovering means disposed between the base and the touch pad.

* * * * *